(12) United States Patent
Hou et al.

(10) Patent No.: US 10,749,478 B2
(45) Date of Patent: Aug. 18, 2020

(54) AMPLIFIER ARRANGEMENT

(71) Applicant: Telefonaktiebolaget LM Ericsson (publ), Stockholm (SE)

(72) Inventors: Rui Hou, Järfälla (SE); Andre Bleker, Bålsta (SE); Lars Ridell Virtanen, Gävle (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 27 days.

(21) Appl. No.: 16/098,348

(22) PCT Filed: May 3, 2016

(86) PCT No.: PCT/SE2016/050399
§ 371 (c)(1),
(2) Date: Nov. 1, 2018

(87) PCT Pub. No.: WO2017/192075
PCT Pub. Date: Nov. 9, 2017

(65) Prior Publication Data
US 2019/0158030 A1    May 23, 2019

(51) Int. Cl.
*H03F 1/07* (2006.01)
*H03F 1/02* (2006.01)
(Continued)

(52) U.S. Cl.
CPC ......... *H03F 1/0288* (2013.01); *H03F 1/0266* (2013.01); *H03F 1/3241* (2013.01);
(Continued)

(58) Field of Classification Search
CPC ........... H03F 1/07; H03F 3/191; H03F 1/0288
(Continued)

(56) References Cited

U.S. PATENT DOCUMENTS

| | | | | |
|---|---|---|---|---|
| 7,944,291 B2 * | 5/2011 | Jung | ...................... | H03F 1/0277 |
| | | | | 330/124 R |
| 8,218,678 B2 * | 7/2012 | Kim | ...................... | H03F 1/3247 |
| | | | | 375/297 |
| 8,324,964 B2 * | 12/2012 | Retz | ...................... | H03F 1/0277 |
| | | | | 330/124 R |

(Continued)

FOREIGN PATENT DOCUMENTS

| WO | 2009/081341 A1 | 7/2009 |
|---|---|---|
| WO | 2014/007703 A1 | 1/2014 |
| WO | 2014/075735 A1 | 5/2014 |

OTHER PUBLICATIONS

Grebennikov, A. et al., "High-Efficiency Doherty Power Amplifiers: Historical Aspect and Modern Trends", Proceedings of the IEEE, vol. 100, No. 12, pp. 3190-3219, (Dec. 2012). (30 pages).

(Continued)

*Primary Examiner* — Henry Choe
(74) *Attorney, Agent, or Firm* — Sage Patent Group

(57) ABSTRACT

An amplifier arrangement (200) for amplifying input signals and a method for operating the amplifier arrangement are disclosed. The amplifier arrangement (200) comprises a main amplifier circuit (210) having an input and an output; a first (221) and second (222) auxiliary amplifier circuits each having an input and an output, wherein each of the first (221) and second (222) auxiliary amplifier circuits being selectively operable to operate in combination with the main amplifier circuit (210). The amplifier arrangement (200) further comprises a single hybrid coupler circuit (230) having a first port (221) being coupled to the output of the main amplifier circuit (210), a second port (232) being coupled to the output of the first auxiliary amplifier circuit (221), a third port (233) being coupled to the output of the second auxiliary amplifier circuit (222) and a fourth port (234) being coupled to the load (240) of the amplifier (200).

17 Claims, 13 Drawing Sheets

(51) Int. Cl.
  *H03F 1/32*    (2006.01)
  *H03F 1/56*    (2006.01)
  *H03F 3/24*    (2006.01)
  *H03F 3/60*    (2006.01)

(52) U.S. Cl.
  CPC ............... *H03F 1/56* (2013.01); *H03F 3/245* (2013.01); *H03F 3/602* (2013.01); *H03F 2200/198* (2013.01); *H03F 2200/204* (2013.01); *H03F 2200/321* (2013.01); *H03F 2200/387* (2013.01); *H03F 2200/411* (2013.01); *H03F 2200/451* (2013.01); *H03F 2200/465* (2013.01); *H03F 2203/21106* (2013.01); *H03F 2203/21139* (2013.01)

(58) Field of Classification Search
  USPC ...................................... 330/124 R, 295, 302
  See application file for complete search history.

(56) References Cited

U.S. PATENT DOCUMENTS 8,598,951 B1 * 12/2013 Hau ..................... H03F 1/0211
                                                      330/124 R
8,670,732 B2 * 3/2014 Borodulin ............. H03F 1/0277
                                                      375/297
2004/0189380 A1    9/2004  Myer et al.

OTHER PUBLICATIONS

Lee, Y. et al., "A highly linear and efficient three-way Doherty amplifier using two-stage GaN HEMT cells for repeater systems", Microwave and Optical Technology Letters, vol. 51, No. 12, pp. 2895-2898, (Dec. 1, 2009). (5 pages).

"Doherty amplifier with cooperative power tracking and bias adaption for high efficiency", Research Disclosure, Mason Publication, Hampshire, GB, vol. 578, No. 37, pp. 453-479, (May 10, 2012). (27 pages).

Lim, J. et al., "A Balanced Power Amplifier Utilizing the Reflected Input Power", IEEE International Symposium on Radio-Frequency Integration Technology, 2009, RFIT 2009, pp. 88-91, (Jan. 9, 2009). (4 pages).

International Search Report and Written Opinion dated Jan. 26, 2017 issued in International Application No. PCT/SE2016/050399. (13 pages).

* cited by examiner

AMPLIFIER ARRANGEMENT

CROSS REFERENCE TO RELATED APPLICATION(S)

This application is a 35 U.S.C. § 371 National Stage of International Patent Application No. PCT/SE2016/050399, filed May 3, 2016, designating the United States.

TECHNICAL FIELD

Embodiments herein relate to an amplifier arrangement. In particular, the embodiments relate to an amplifier arrangement comprising a single hybrid coupler circuit for combining output power from a main amplifier circuit and a first and second auxiliary amplifier circuits.

BACKGROUND

In a wireless communication system, a transmitter employs power amplifiers (PA) to boost signal power for radio transmission. To be efficient in occupying frequency spectrum, modern communication signals have a large peak-to-average power ratio (PAR). The capability to reach peak power and to maintain energy efficiency at the average power levels is contradictory for conventional single branch PAs. More sophisticated PA architectures employ multiple PA branches to satisfy both the power and the efficiency requirements. Among these PA architectures, the most widely used in wireless infrastructures is Doherty Power Amplifiers (DPA) described in e.g., Andrei Grebennikov and Senad Bulja, "High-Efficiency Doherty Power Amplifiers: Historical Aspect and Modern Trends", Proceedings of the IEEE, Vol. 100, No. 12, December 2012.

A DPA comprises of at least 2 PA branches, namely a main and an auxiliary branch. In operation, an auxiliary PA in the auxiliary branch injects power into a main PA in the main branch to modulate its effective load impedance according to a specific pattern, hereafter referred to as Doherty load modulation, such that total efficiency is maximized not only at the peak-power but also at the average-power level. At any other power levels between the peak-power and the average-power level, the efficiency degrades unavoidably. The degradation is more severe for larger PAR signals. A common remedy to enhance efficiency at medium power levels is to employ more PA branches.

A 3-way DPA comprises of 3 PA branches, namely a main PA and two auxiliary PAs, Aux1 and Aux2. Aux1 modulates the load of the main PA the same as that in a 2-way DPA, to maximize efficiency at the low and medium power levels. Aux2 modulates the loads of both the main and Aux1 PAs to maximize efficiency at the peak power level. As a result, total efficiency at 3 different power levels can be maximized. The energy saving is considerable in high PAR applications.

The power from multiple PA branches needs to be combined properly for Doherty load modulation. The existing power combiners for 3-way DPAs have problems in size, bandwidth, complexity and cost.

Conventional Doherty power combiners employ multiple pieces of quarter-wavelength transmission lines as impedance inverters. The size of these transmission lines are determined by operating frequencies and the dielectric materials and thus is difficult to miniaturize. Their effective bandwidth is also limited.

An alternative technique disclosed in US2004189380 solves both the size and bandwidth problems for a 2-way DPA by employing a high reflection terminated hybrid coupler as a 2-way Doherty power combiner. An extension scheme for more than 2 branches of PAs is also published. However, an addition of another branch to make it a 3-way DPA requires the addition of another hybrid coupler with possibly a different coupling factor, duplicating the size, complexity and cost.

In WO2014075735, a 3-way DPAs employing a coupler circuit as the 3-way Doherty power combiner is disclosed. However, the coupler circuit is a two-section coupling structure comprising feeding ports for the amplifier stages of the main amplifier and each of the auxiliary amplifiers. Thus size, complexity or cost are not decreased with this 3-way DPA.

The aforementioned size and cost drawbacks are especially acute for implementations in Monolithic Microwave Integrated Circuits (MMIC), where a majority of chip area of the MMIC is occupied by passive components. In these implementations, an additional coupler together with associated interconnections could increase the chip area and cost by more than 50%.

SUMMARY

Therefore, it is an object of embodiments herein to provide a power amplifier with improved performance and reduced size, complexity and cost.

According to one aspect of embodiments herein, the object is achieved by an amplifier arrangement for amplifying input signals to an output signal for delivering to a load. The amplifier arrangement comprises a main amplifier circuit having an input for receiving an input signal and an output; a first and second auxiliary amplifier circuits each having an input for receiving an input signal and an output. Each of the first and second auxiliary amplifier circuits is selectively operable to operate in combination with the main amplifier circuit. The amplifier arrangement further comprises a single hybrid coupler circuit comprising a first port being coupled to the output of the main amplifier circuit, a second port being coupled to the output of the first auxiliary amplifier circuit, a third port being coupled to the output of the second auxiliary amplifier circuit and a fourth port being coupled to the load of the amplifier.

According to one aspect of embodiments herein, the object is achieved by a method for operating a power amplifier arrangement to amplify input signals to an output signal for delivering to a load. The power amplifier arrangement comprises a main amplifier circuit, a first and second auxiliary amplifier circuits and a single hybrid coupler circuit. The single hybrid coupler circuit comprises a first port being coupled to the output of the main amplifier circuit, a second port being coupled to the output of the first auxiliary amplifier circuit, a third port being coupled to the output of the second auxiliary amplifier circuit and a fourth port being coupled to the load of the amplifier. The power amplifier arrangement monitors the input signal power. When the input signal is in a first power range, the main amplifier circuit is operating by applying a first drive signal having a first gain with respective to the input signal. When the input signal is in a second power range, the main amplifier circuit is operating by applying the first drive signal having the first gain and the first auxiliary amplifier circuit is operating by applying a second drive signal having a second gain with respective to the input signal. When the input signal is in a third power range, the main, the first and second auxiliary amplifier circuits are operating by applying the first drive signal with a third gain to the main amplifier circuit, applying the second drive signal with a fourth gain to the first auxiliary amplifier circuit and applying a third drive signal with a fifth gain to the second auxiliary amplifier circuit. Output powers from the main, the first and second auxiliary amplifier circuits are combined in the hybrid coupler circuit and an output power is delivered to the load from the fourth port of the hybrid coupler circuit.

According to the embodiments herein, power from 3 amplifier circuits are combined to achieve Doherty load modulation by only a single hybrid coupler which is a single coupling structure. Compared with prior art 3-way DPA with coupler combiners, the power amplifier arrangement according to the embodiments herein reduce the number of coupler structures from two to one. As a result, the power loss, size, complexity and cost associated with coupler structures are also reduced.

Thus, embodiments herein provide an amplifier arrangement with improved performance and reduced size, complexity and cost.

BRIEF DESCRIPTION OF THE DRAWINGS

Examples of embodiments herein are described in more detail with reference to attached drawings in which.

DETAILED DESCRIPTION

As part of developing embodiments herein, some explanation on operation of a conventional 3-way DPA is useful for understanding operation of the amplifier arrangement according to embodiments herein.

Figure 1A:
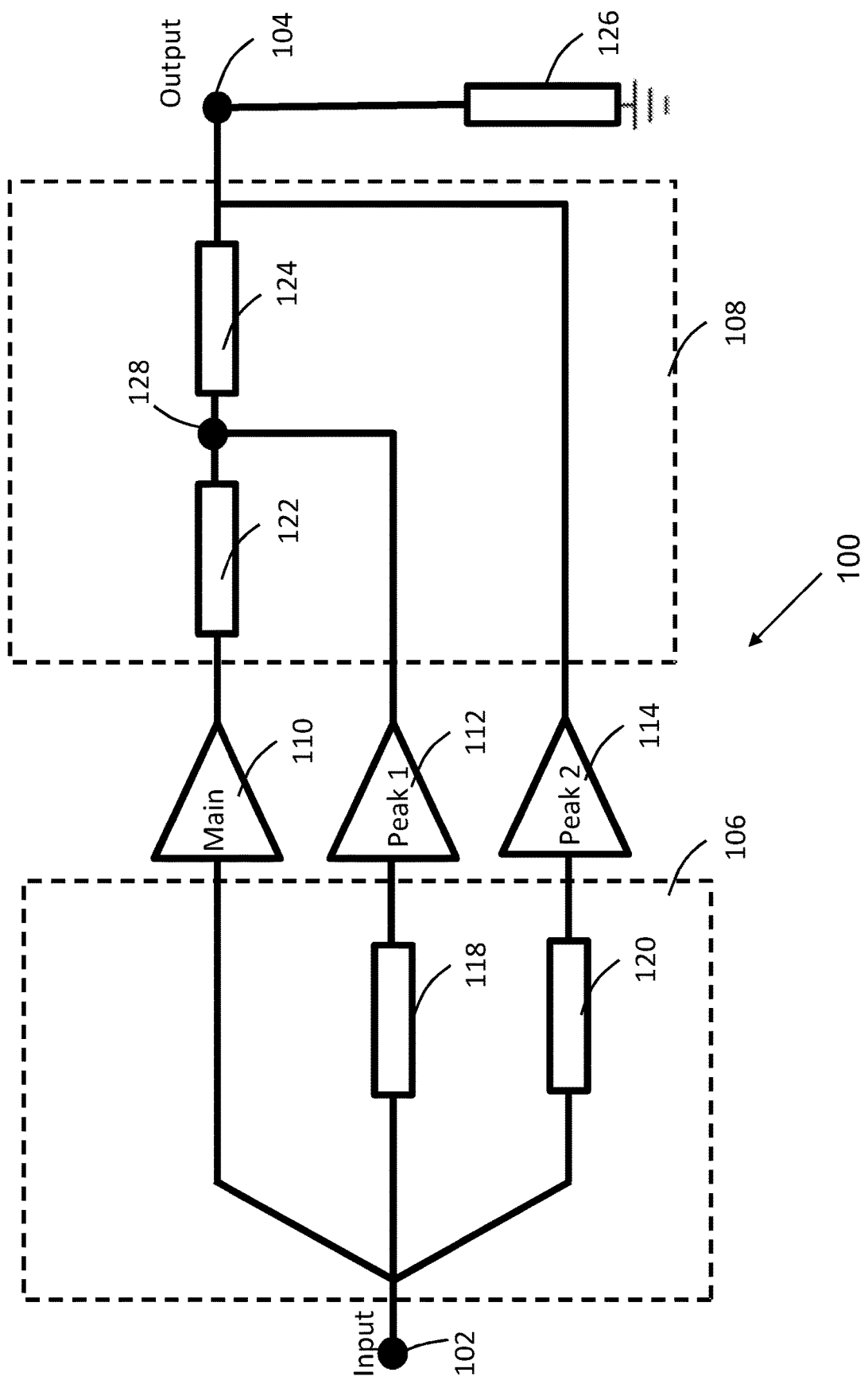
FIG. 1 shows a) a 3-way DPA and b) its efficiency curve according to prior art.
Figure 1B:
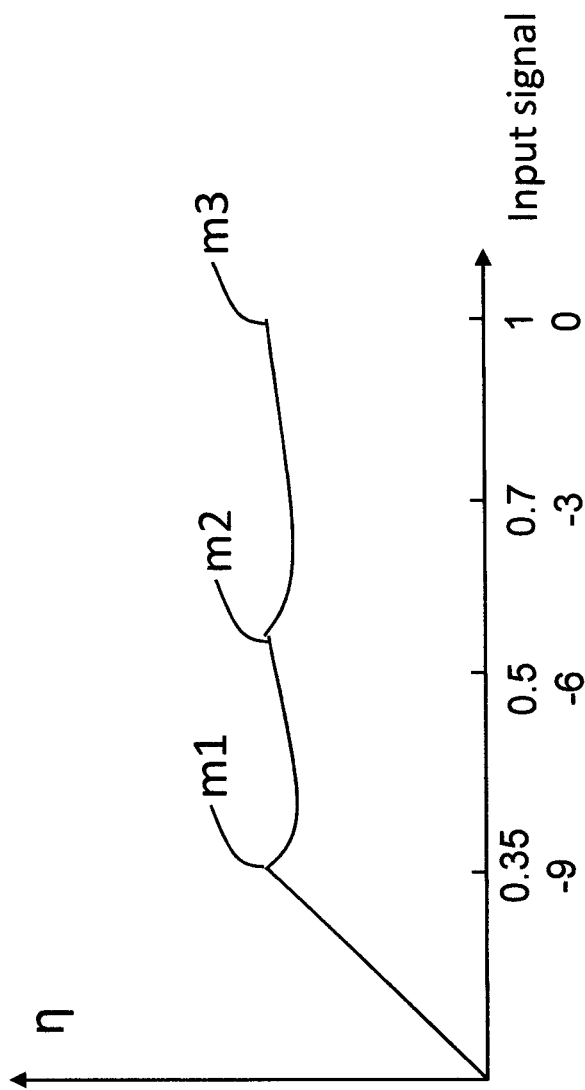

In FIG. 1, a) is a block diagram of a conventional 3-way Doherty amplifier comprising an amplifier input 102, an amplifier output 104, an input network 106, an output network 108, a main amplifier 110, a first peak amplifier 112, and a second peak amplifier 114. Input network comprises a splitter 116 to distribute the power of the input signal, received at the input 102, between the main amplifier 110, the first and second peak amplifiers 112, 114. Input network further comprises an impedance 118 between the input 102 and an input of the first peak amplifier 112, and an impedance 120 between the input 102 and an input of the second peak amplifier 114. The output network 108 comprises a series arrangement of a first impedance 122 and a second impedance 124 between an output of the main amplifier 110 and the output 104. An output of the first peak amplifier 112 is connected between the first and second impedances 122, 124, and an output of the second peak amplifier 114 is connected to the output 104. Amplifier 100 is used to drive a load 126, such as a resistance.

The operation of the amplifier 100 can be divided into three main regions. At low power levels, where the input power is lower than threshold levels of the first and second peak amplifiers 112, 114, the main amplifier 110 is the only device supplying current to the load 126. The impedance present at the output of the main amplifier 110, due to the double impedance inverters 122 and 124, ensures that main amplifier 110 enters voltage saturation well below its maximum peak power capability and reaches its maximum efficiency point. This results in a first peak efficiency point in back-off, as shown in FIG. 1 b) efficiency curve, marked by m1. If the input power level exceeds the threshold level, sometime referred to as a transition point, of the first peak amplifier 112, the amplifier 112 starts to deliver current which adds in-phase with the current from the main amplifier 110 at a node 128 between the first and second impedances 122 and 124, increasing the Radio Frequency (RF) output voltage at node 128. Therefore, the apparent impedance seen by the output of impedance inverter 122 is higher than the actual equivalent load impedance at node 128. This is referred to as active load-pulling effect. Owing to this active load-pulling effect, the impedance, as seen by the output of main amplifier 110, decreases and its power contribution increases. The output power from both the first and second peak amplifiers 110 and 112 increases with increasing signal level until the first peak amplifier 112 also enters voltage saturation. This results in a second peak efficiency point in back-off, as shown in FIG. 1 b) efficiency curve, marked by m2. The consequence of voltage saturation at the node 128 is that current saturation occurs at the main amplifier 110, resulting in disrupted load-line modulation. For the remainder of the input power range the main amplifier 110 experiences overdrive resulting in heavy saturation and severe linearity degradation. One way to avoid this is utilizing active drive profiling, which results in a considerable increase of the circuit's complexity. If the input power level exceeds the threshold level of the second peak amplifier 114, the second amplifier 114 starts to deliver current which adds in-phase with the currents from the first peak amplifier 114 and from the main amplifier 110 at output 104. This in turn results in further increasing the RF output voltage at the load 126.

The output power from each of the first and second peak amplifiers 112 and 114 increases with increasing signal level until the peak power capability is reached. Within the region between the first transition point and peak power, the efficiency of the main amplifier 110 remains at its maximum value. The efficiency of the first peak amplifier 112 remains at its maximum value between the second transition point and peak power. The efficiency of second peak amplifier 114 varies between zero and its maximum value at its maximum peak power level. Three-way Doherty amplifier 100 thus exhibits three efficiency peaking points, as shown in FIG. 1 b).

Figure 2:
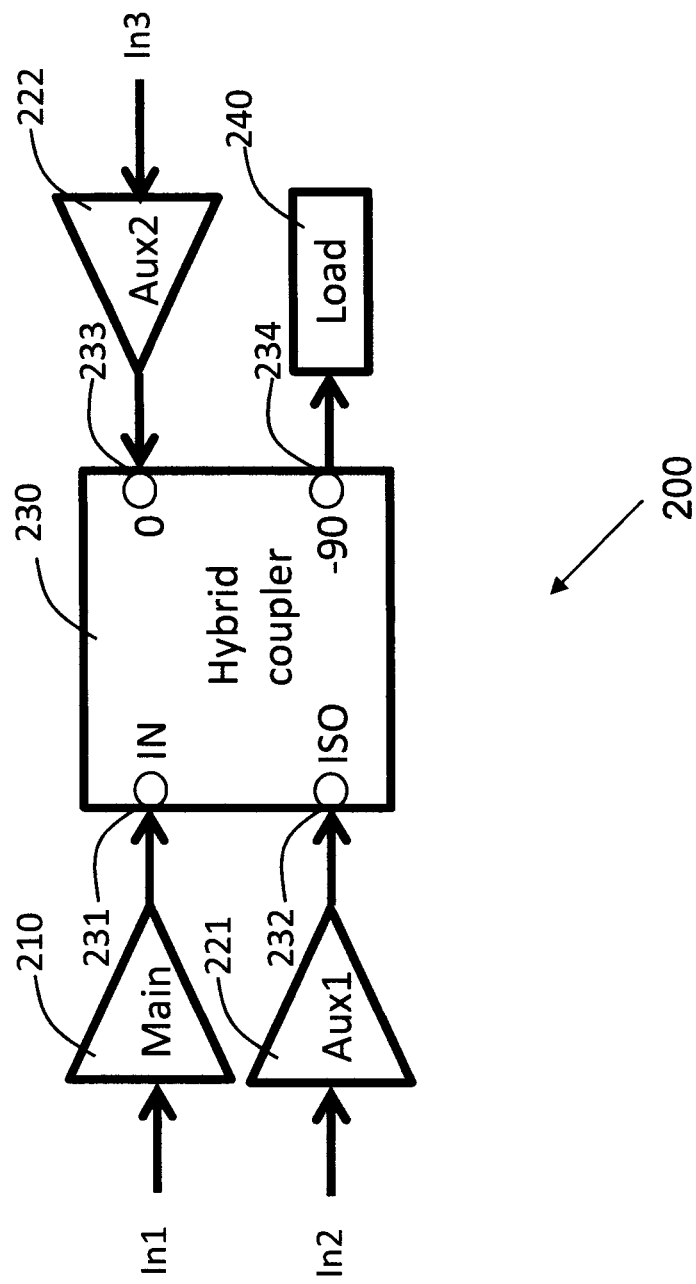
FIG. 2 is a schematic block diagram illustrating an amplifier arrangement according to a first embodiment herein.

FIG. 2 shows a block diagram of an amplifier arrangement 200 for amplifying input signals, e.g. three separate input signals, to an output signal for delivery to a load according to embodiments herein. The objective of the amplifier arrangement 200 is to enhance its total efficiency for high PAR signals. The efficiency performance of the amplifier arrangement 200 is equivalent to the conventional 3-way Doherty PA described above.

The amplifier arrangement 200 comprises a main amplifier circuit 210 having an input In1 for receiving one of the input signals and an output. The amplifier arrangement 200 further comprises a first and a second auxiliary amplifier circuit 221, 222, each having an input In2, In3 for receiving one of the input signals and an output. Each of the first and second auxiliary amplifier circuits 221, 222 is selectively operable to operate in combination with the main amplifier circuit 210.

The amplifier arrangement 200 further comprises a single hybrid coupler circuit 230 The hybrid coupler 230 comprises a first port 231 being coupled to the output of the main amplifier circuit 210, a second port 232 being coupled to the output of the first auxiliary amplifier circuit 221, a third port 233 being coupled to the output of the second auxiliary amplifier circuit 222 and a fourth port 234 being coupled to a load 240.

As illustrated in FIG. 2, the amplifier arrangement 200 uses only the single hybrid coupler 230 instead of multiple couplers or coupling structures necessary in prior art, to achieve 3-way DPA operation. The output power from the main, first and second amplifier circuits 220, 221, 222 are individually injected into the first, second and third ports 231, 232, 233 of the hybrid coupler 230. The combined power is delivered to the load 240 from the fourth port 234 of the hybrid coupler 230.

According to some embodiments herein, the hybrid coupler circuit 230 is a quadrature hybrid coupler with four ports, as shown in FIG. 2. Any one of the four ports, i.e. input port IN, In-phase output port '0', isolation port ISO and quadrature output port '−90', can be selected arbitrarily as a first port 231. After the first port 231 is selected, the second, third and fourth ports 232-234 will be uniquely defined. For example, in the case shown in FIG. 2, the input port IN is selected as the first port 231, which is coupled to the main amplifier circuit 210. Then the isolation port ISO which is isolated from the input port IN will be the second port 232 and is coupled to the output of the first auxiliary amplifier circuit 221. The In-phase output port '0' which has a 0 degree transfer from the input port IN will be the third port 233 and is coupled to the output of the second auxiliary amplifier circuit 222. And the quadrature output port '−90' which has a −90 degree transfer from the input port IN will be the fourth port 234 and is coupled to the load 240. For another example, if the In-phase output port '0' is selected as the first port 231, which is coupled to the main amplifier circuit 210. Then the quadrature output port '−90' will be the second port 232 and is coupled to the output of the first auxiliary amplifier circuit 221. The input port IN will be the third port 233 and is coupled to the output of the second auxiliary amplifier circuit 222. And the isolation port ISO will be the fourth port 234 and is coupled to the load 240. For a third example, if the quadrature output port '−90' is selected as the first port 231, which is coupled to the main amplifier circuit 210. Then the in-phase output port '0' will be the second port 232 and is coupled to the output of the first auxiliary amplifier circuit 221. The isolation port ISO will be the third port 233 and is coupled to the output of the second auxiliary amplifier circuit 222. And the input port IN will be the fourth port 234 and is coupled to the load 240. For a last example, if the isolation port ISO is selected as the first port 231, which is coupled to the main amplifier circuit 210. Then the input port IN will be the second port 232 and is coupled to the output of the first auxiliary amplifier circuit 221. The quadrature output port '−90' will be the third port 233 and is coupled to the output of the second auxiliary amplifier circuit 222. And the in-phase output port '0' will be the fourth port 234 and is coupled to the load 240.

According to some embodiments herein, the hybrid coupler circuit 230 may be constructed as a Branch-line coupler, a lumped elements coupler, a coupled-line coupler or a Lange coupler. For example, Branch-line coupler is made from 4 pieces of Transmission Lines (TL). Coupled-line coupler is made from 2 pieces of mutually coupled TLs. Lumped element coupler is made from inductors and capacitors. Lange couplers are made from interleaved multiple sections of coupled TLs.

Figure 3:
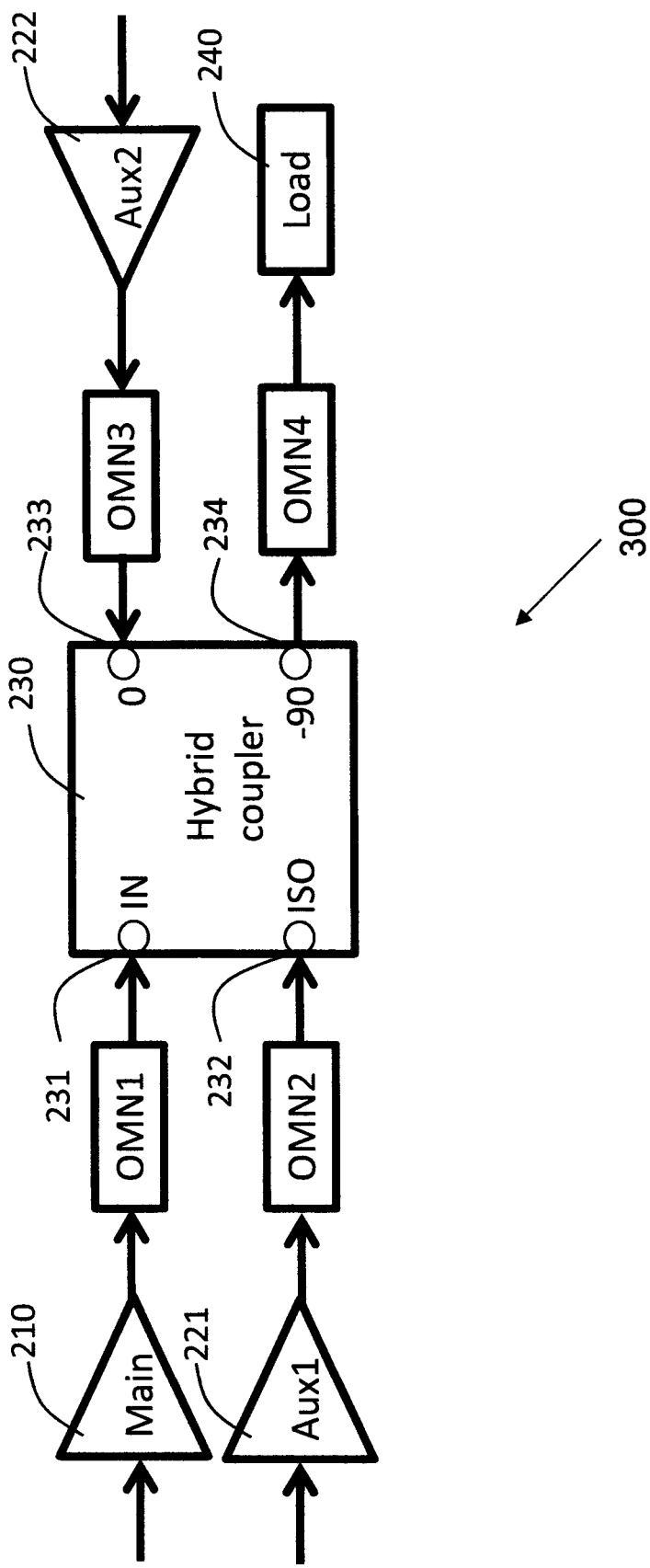
FIG. 3 is a schematic block diagram illustrating an amplifier arrangement according to a second embodiment herein.

According to some embodiments herein, the amplifier arrangement 200 may comprise one or more output matching networks OMN1, OMN2, OMN3, OMN4, each output matching network is coupled to a respective one of the four ports of the hybrid coupler circuit 230 to perform impedance transformation, as shown in FIG. 3.

According to some embodiments herein, the output matching network may comprise transmission lines, such as strip lines, micro-strip lines and coplanar waveguide, or lumped elements, such as capacitors and inductors.

According to some embodiments herein, a characteristic impedance of the hybrid coupler circuit 230 is configured to match a loading impedance of the load 240.

To explain the functionality of the amplifier arrangement 200, a particular embodiment, where the hybrid coupler circuit 230 is a conventional 3 dB quadrature hybrid coupler is discussed in the following. As shown in FIG. 2, the outputs of the main amplifier circuit 210 and a first and second auxiliary amplifier circuits 221, 222 are connected to the input IN, isolation ISO, and in-phase output '0' port, respectively, whereas the combined power is output from the quadrature output port '−90' to the load 240.

Figure 4:
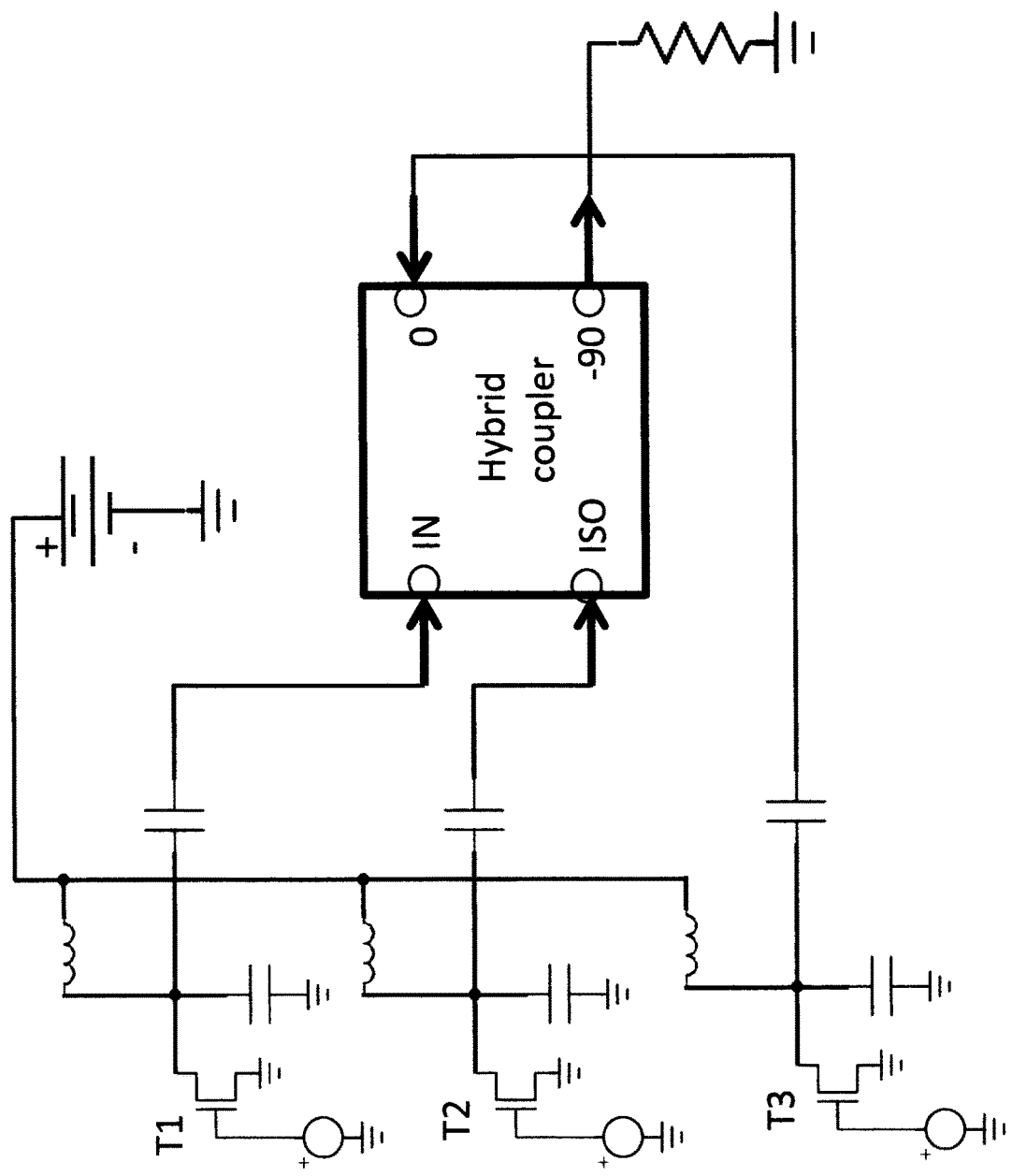
FIG. 4 is a schematic block diagram illustrating an amplifier arrangement according to a third embodiment herein.

A circuit implementation of the amplifier arrangement 200 according to one embodiment is illustrated schematically in FIG. 4. According to some embodiments herein, the main amplifier circuit 210 and the first and second auxiliary amplifier circuits 221, 222 may be implemented by transistors T1, T2, T3 respectively. T1, T2, T3 may be any of a high electron mobility transistor (HEMT), a heterojunction bipolar transistor (HBT) or a laterally-defused metal-oxide-semiconductor (LDMOS) transistor. These transistors may be made of semiconductor materials from any of Gallium nitride (GaN), Silicon (Si), Gallium arsenide (GaAs) or Indium phosphide (InP).

Figure 5A:
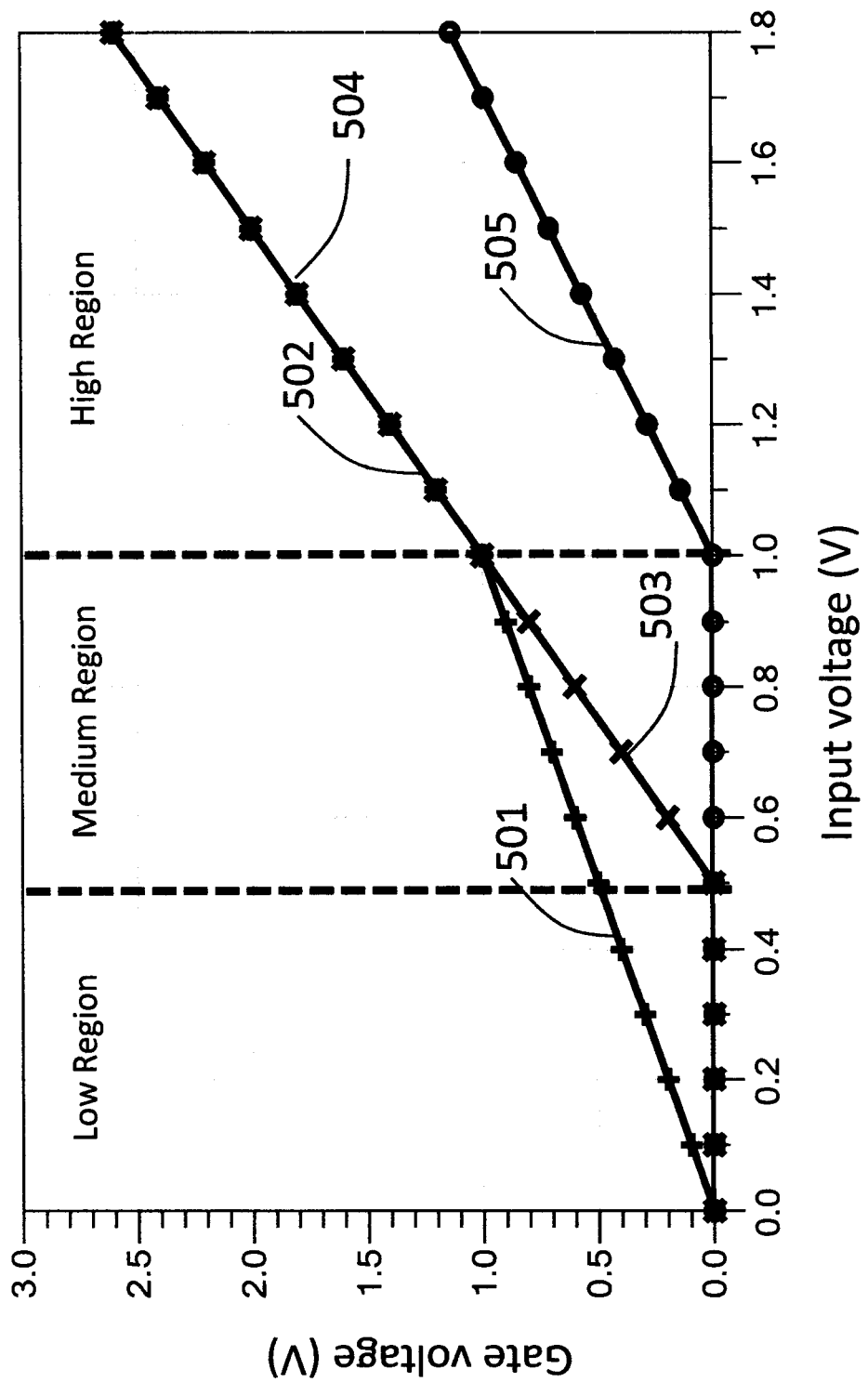
FIGS. 5a and 5b are diagrams illustrating drive signals to the amplifier arrangement according to embodiments herein.

The excitation of the 3 amplifier circuits follows a switch on sequence similar to conventional 3-way DPAs. FIG. 5a shows drive signals, i.e. gate voltage to the transistors T1, T2, T3 in the 3 amplifier circuits 210, 221, 222, verses input signal voltage, wherein curve marked with '+' is the drive signal to the main amplifier circuit 210, curve marked with 'x' is the drive signal to the first Aux1 amplifier circuit 221, and curve marked with 'o' is the drive signal to the second Aux2 amplifier circuit 222. The drive signals to the main amplifier circuit 210, the first and second auxiliary amplifier circuits 221, 222 in this case are delayed by 0, 90 and 180 degrees respectively with respect to the input signal. More specifically, at low input signal power levels, e.g. input signal voltage is below 0.5 V, only the main amplifier circuit 210 operates, the drive signal to the main amplifier circuit 210, see curve 501, has a first power ramp slope, i.e. the drive signal has a first gain with respect to the input signal. At medium input signal power levels, e.g. input signal voltage is 0.5 V-1.0 V, the first auxiliary amplifier circuit 221 switches on and starts to operate, its drive signal has a power ramp slope twice as much as that of the main amplifier circuit 210, see curve 503. At high power levels, e.g. input signal voltage is above 1.0 V, the second auxiliary amplifier circuit 222 switches on and starts to operate, its drive signal has a power ramp slope $1/\sqrt{2}$ times that of the first auxiliary amplifier circuit 221, see curve 505, whereas the drive signal to the main amplifier circuit 210 switches to a second power ramp slope, see curve 502, which is higher than the first slope, and is the same as that of the first auxiliary amplifier circuit 221, see curve 504. In this particular embodiment, the slopes of curve 502, 503 and 504 are identical. But in general, these curves may have different slopes, see FIG. 5b. Specifically, the drive signal to the main amplifier circuit 210 has different slopes or gain depending on different input signal levels. The slope for high input signal power levels is higher than the slope for medium input signal power levels. This gain increase of the drive signal to the main amplifier 210 at high input power region is important to achieve high efficiency and high linearity for the amplifier arrangement 200, since only the single hybrid 3-way combiner is used according to the embodiments herein. In conventional DPA, the drive signal slope to the main amplifier for high input signal power level is flat and which is lower than that of for medium input signal level. In another prior art DPA disclosed in U.S. Pat. No. 8,022,760, the drive signal slope to the main amplifier for high input signal power level is the same as that of for medium input signal level. For the proposed 3-way DPA with a single hybrid combiner, either of these drive signals from prior arts would lead to non-linearity and efficiency degradation at high input power region.

Figure 6A:
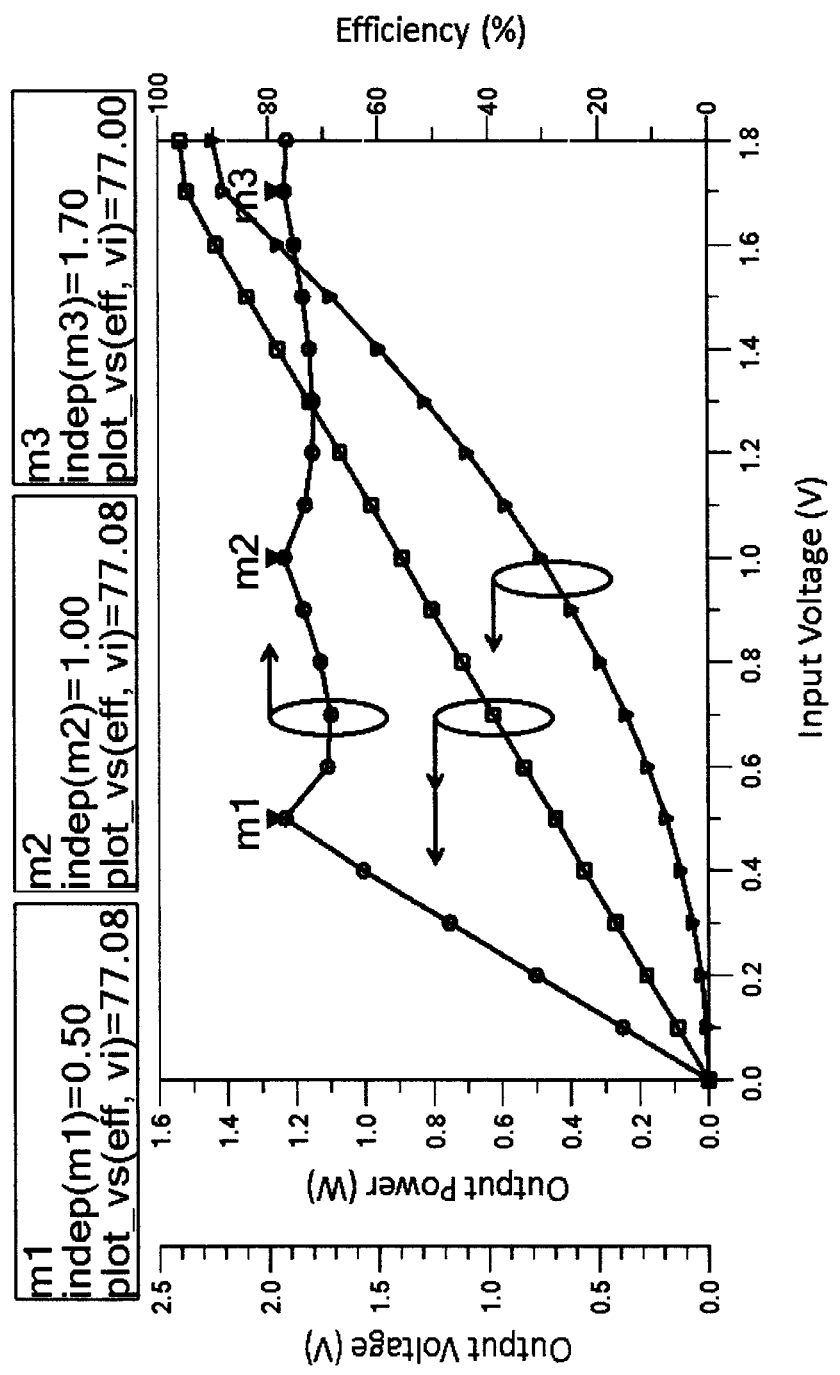
FIGS. 6a and 6b are diagrams illustrating simulation results of the amplifier arrangement according to embodiments herein.

The aforementioned operation is simulated by harmonic balance in Keysight Advanced Design System. In the simulation, transistors T1, T2, T3 have identical drain bias of 1 V and peak current capacities of $1+\sqrt{2}$, $1+\sqrt{2}$ and 1 A, respectively. All transistors are biased and harmonically terminated for Class B operation, therefore they have a theoretical efficiency of 78% each, and a peak output power of 0.6 W, 0.6 W and 0.25 W, respectively. The loading resistance and the characteristic impedance of the hybrid coupler circuit are both 2 ohms. The simulation result is shown in FIG. 6a. As can be observed from the plot, 3 efficiency maximum of 77% for Class B operation of the amplifier arrangement 200 exist at power levels 0, −4.6 and −10.6 dB back-off from the maximum power level, marked by m1, m2, m3 at input signal voltage of 0.5 V, 1.0 V, 1.7 V respectively. The output voltage is linearly dependent on input signal voltage. The peak power delivered to the load is 1.4 W, similar as the combined power capacity from the 3 transistors, i.e. 0.6+0.6+0.25=1.45 W.

Figure 5B:
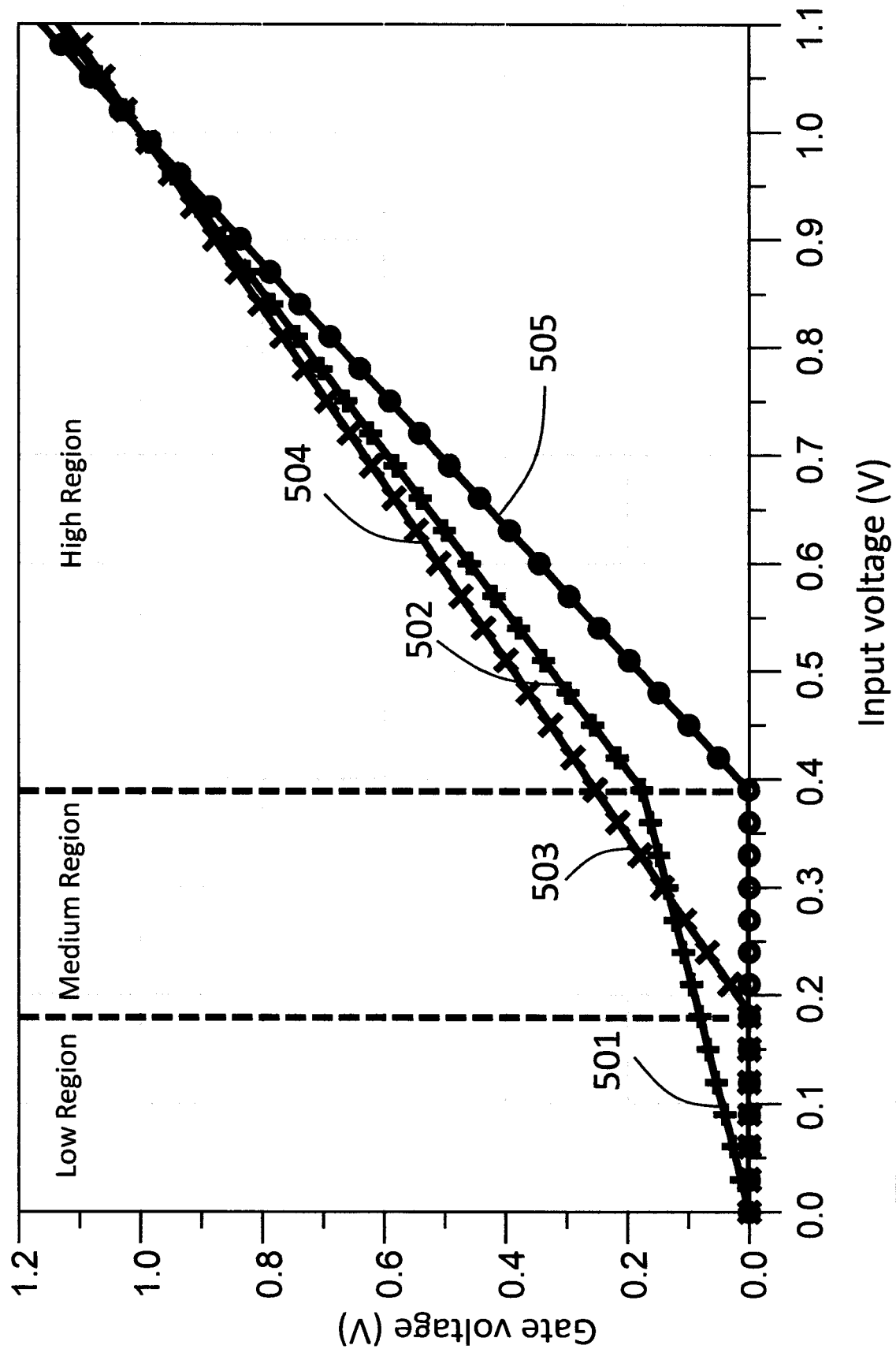
Figure 6B:
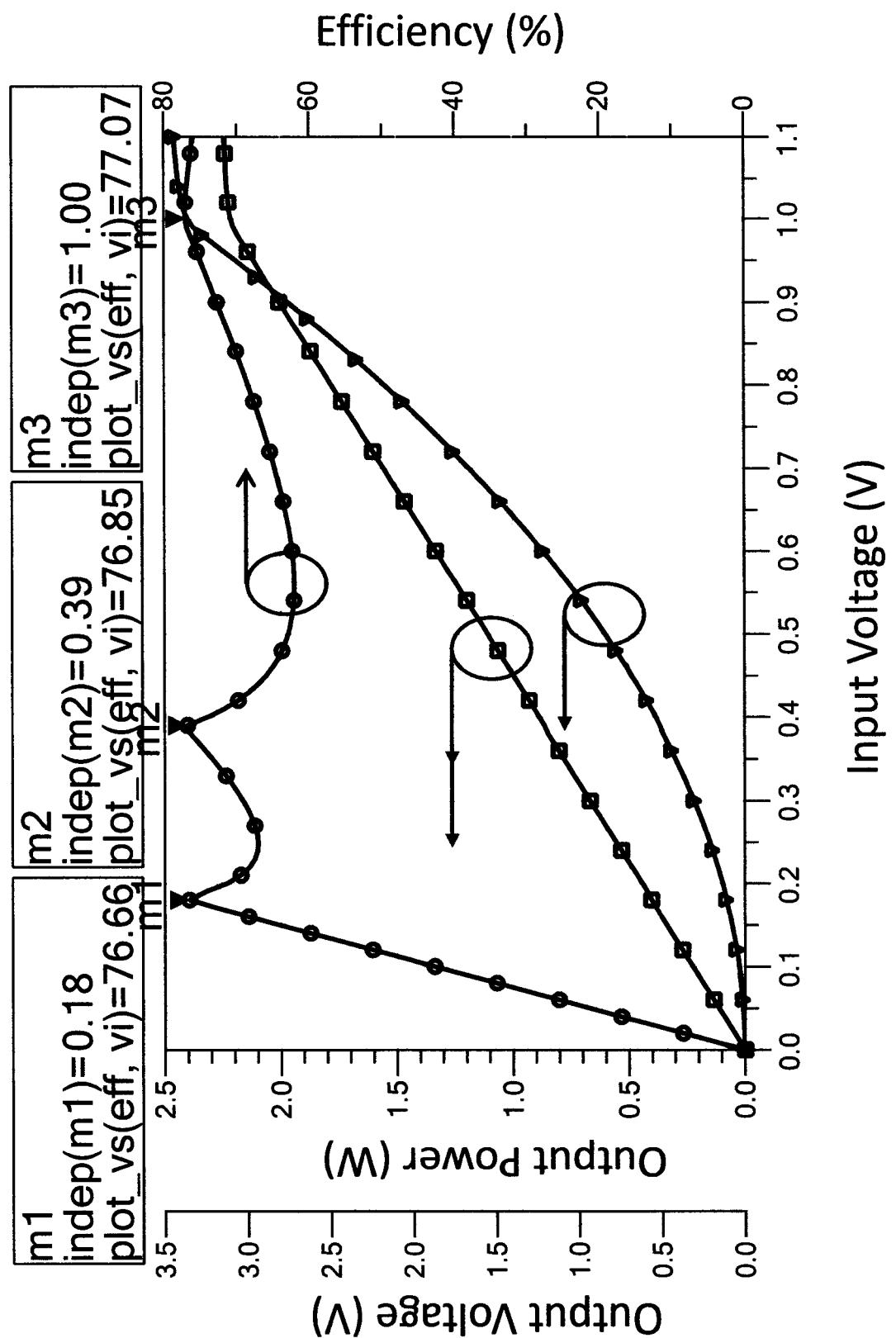

Simulations have been performed for another example, where the hybrid coupler is a 4.77 dB coupler, i.e. the power ratio for in-phase and quadrature output port is 2:1. The sizes, i.e. the peak current capacities for transistors T1, T2 and T3 are 4.0, 3.1 and 2.7 A for the main amplifier circuit 210, the first Aux1 221 and second Aux2 amplifier circuit 222, respectively. The driving signals are shown in FIG. 5b. As can be seen the slopes for curve 502 and 504 are not the same anymore. The performance is shown in FIG. 6b, as can be observed from the plot, 3 efficiency maximum of 77% for Class B operation of the amplifier arrangement 200 exist, marked by m1, m2, m3 at input signal voltage of 0.18V, 0.39 V, 1 V respectively. The effectiveness of the proposed technique is accordingly validated.

Figure 7:
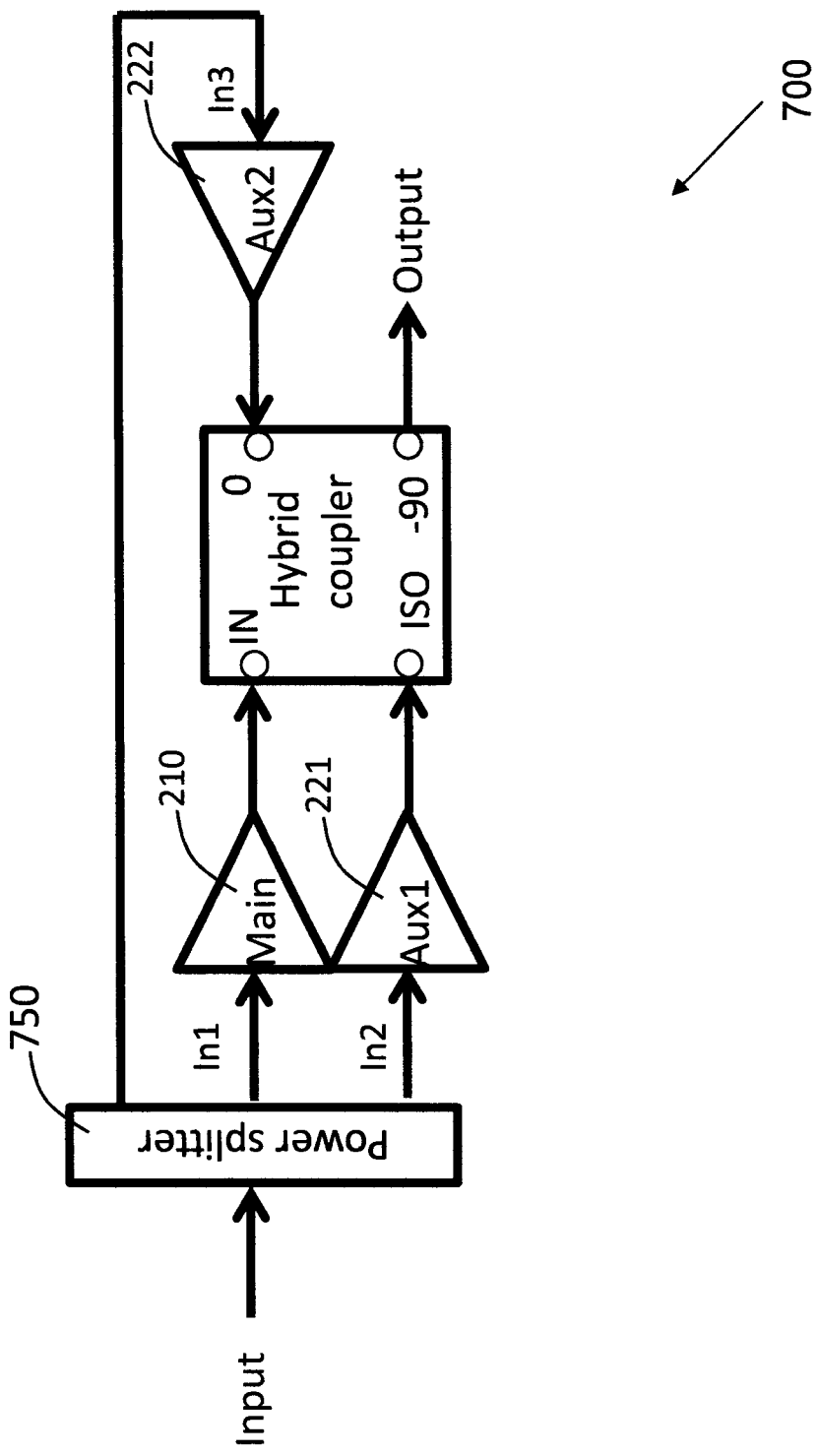
FIG. 7 is a schematic block diagram illustrating an amplifier arrangement according to a fourth embodiment herein.

According to some embodiments, the amplifier arrangement 200 may be a single-input-single-output amplifier as shown in FIG. 7. Then the amplifier arrangement 200 may further comprise a power splitter 750 to split the input signal and feed each split input signal to the respective input In1, In2, In3 of the main, the first and second auxiliary amplifier circuits 210, 221, 222. The power splitter may be an uneven 3-way Wilkinson splitter.

Figure 8:
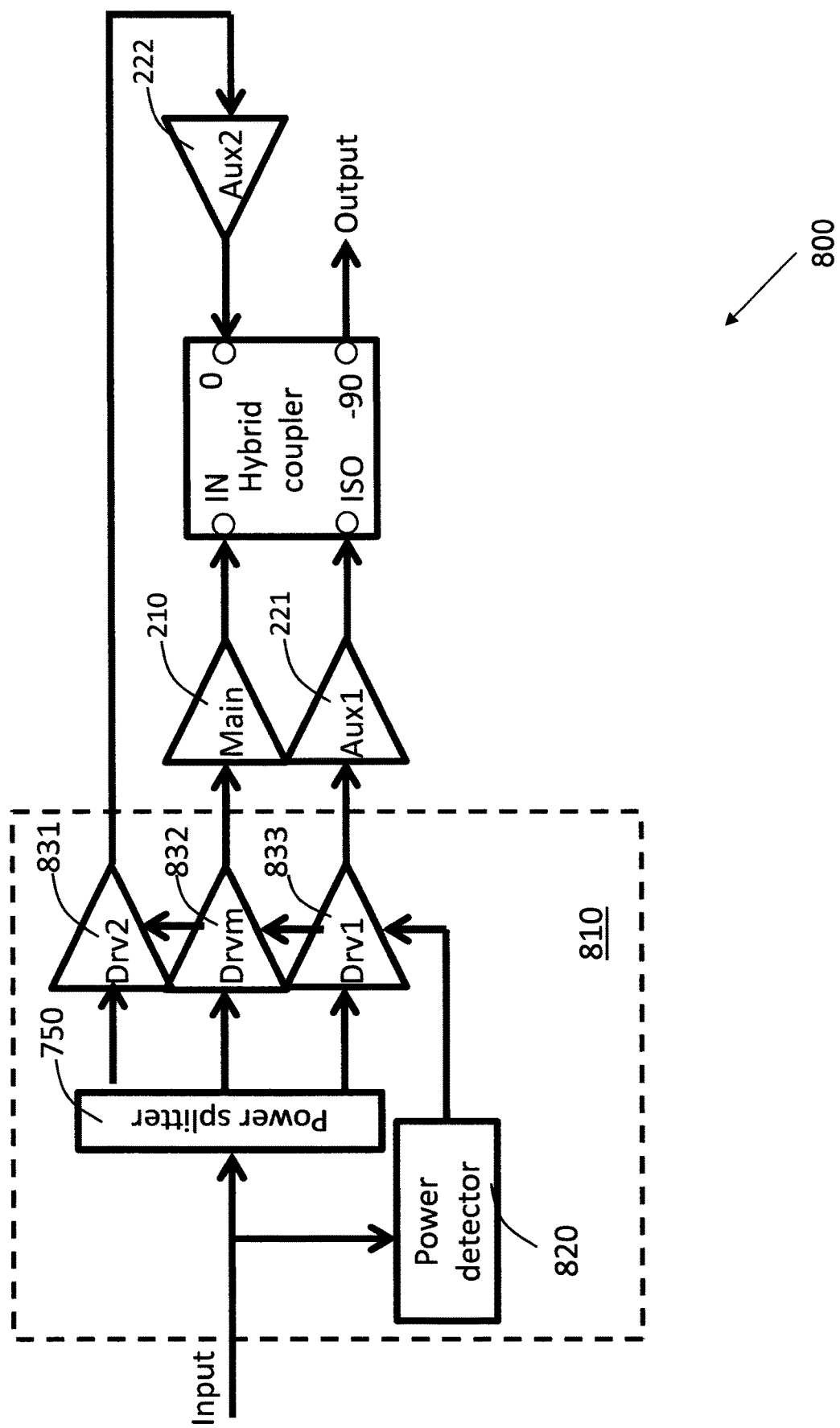
FIG. 8 is a schematic block diagram illustrating an amplifier arrangement according to a fifth embodiment herein.

According to some embodiments herein, the amplifier arrangement 200 may comprise a power detector 860, as shown in FIG. 8. The power detector 860 may be configured to sense the input signal power and output from the power detector is used to control the power of the driving signals to the main, the first and second auxiliary amplifier circuits 210, 221, 222. For example, the amplifier arrangement 200 may comprise drive amplifiers Drvm 831, Drv1 832, Drv2 833, each being configured to receive the input signal and amplify the input signal to a drive signal with a certain gain, and provide or apply the drive signals to the main, the first and second auxiliary amplifier circuits 210, 221, 222, respectively. The output from the power detector 860 may control the gain of the drive amplifiers Drvm, Drv1, Drv2. In this respect, the power detector 860, power splitter 750 and the variable-gain amplifiers Drvm, Drv1, Drv2 may be defined as signal processing components 810. They may be implemented as, for example, analog hardware, digital firmware or software algorithms. Therefore according to some embodiments herein, the amplifier arrangement 200 may comprise a signal processing components 810 configured to control power of drive signals and selectively apply the drive signals with a specific gain with respect to the input signal to the main amplifier circuit 210, the first and second auxiliary amplifier circuits 221, 222 such that the drive signal to the main amplifier circuit 210 has a higher gain for higher level input signals than a gain for lower level input signals, and each of the first and second auxiliary amplifier circuits 221, 222 is selectively operable to operate in combination with the main amplifier circuit 210.

Figure 9:
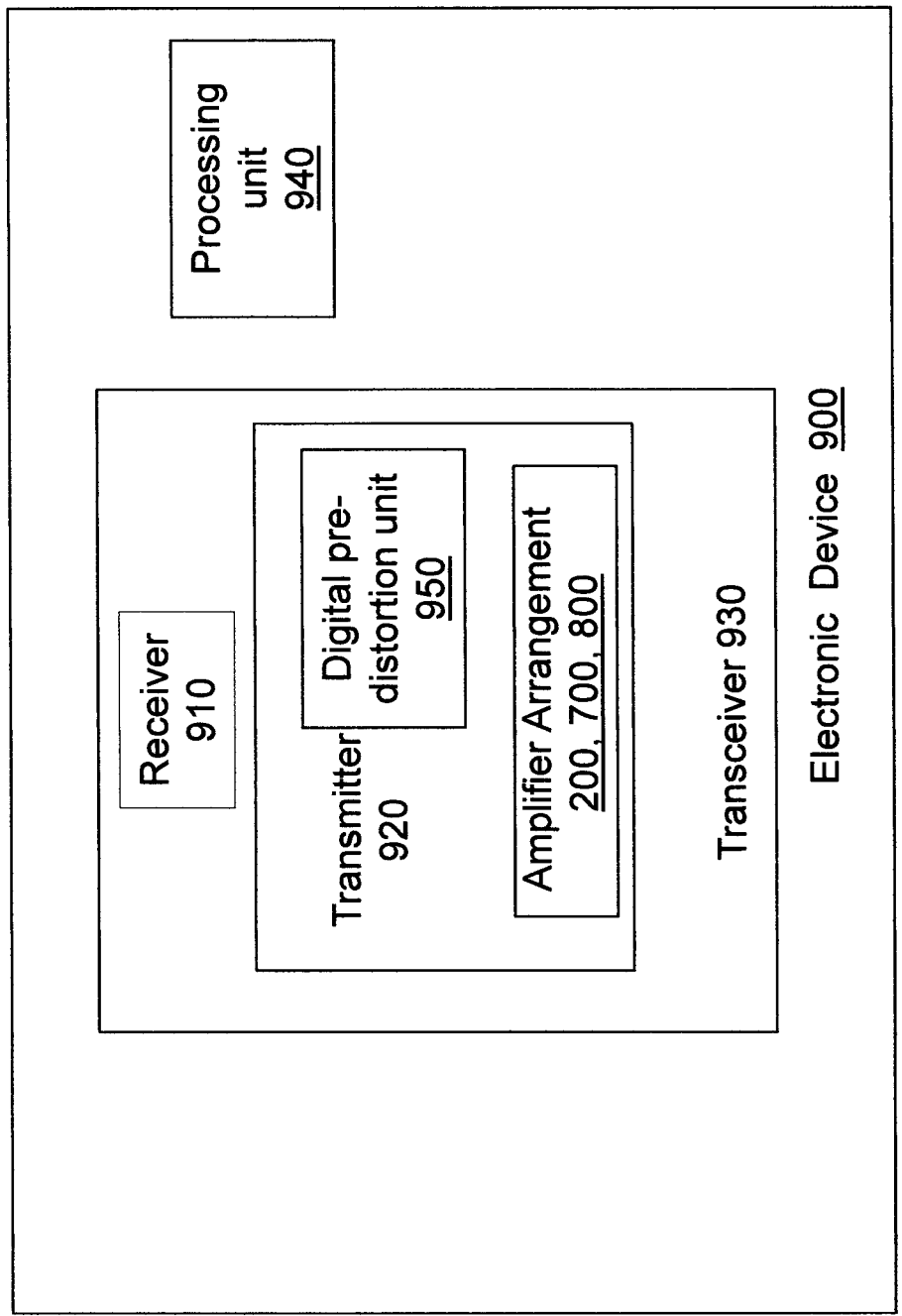
FIG. 9 is a block diagram illustrating an electronic device in which embodiments herein may be implemented.

The amplifier arrangement 200 according to embodiments herein may be employed in various integrated circuits, e.g. monolithic integrated circuits, electronic devices or communication devices, e.g. radio transmitters, radio base stations, mobile stations. FIG. 9 shows a block diagram of a general electronic device 900, which may be, e.g. an integrated circuit, a mobile station or a radio base station. The electronic device 900 may comprise other units, where a transceiver 930 comprising a receiver 910 and a transmitter 920 and a processing unit 940 are shown.

In practice, the proposed amplifier arrangement 200, as many other conventional DPAs, may have insufficient linearity for certain applications. In these cases, the system linearity can often be enhanced by digital pre-distortion. Accordingly, the transmitter 920 may further comprise a digital pre-distortion unit 950 connected to the amplifier arrangement 200.

Figure 10:
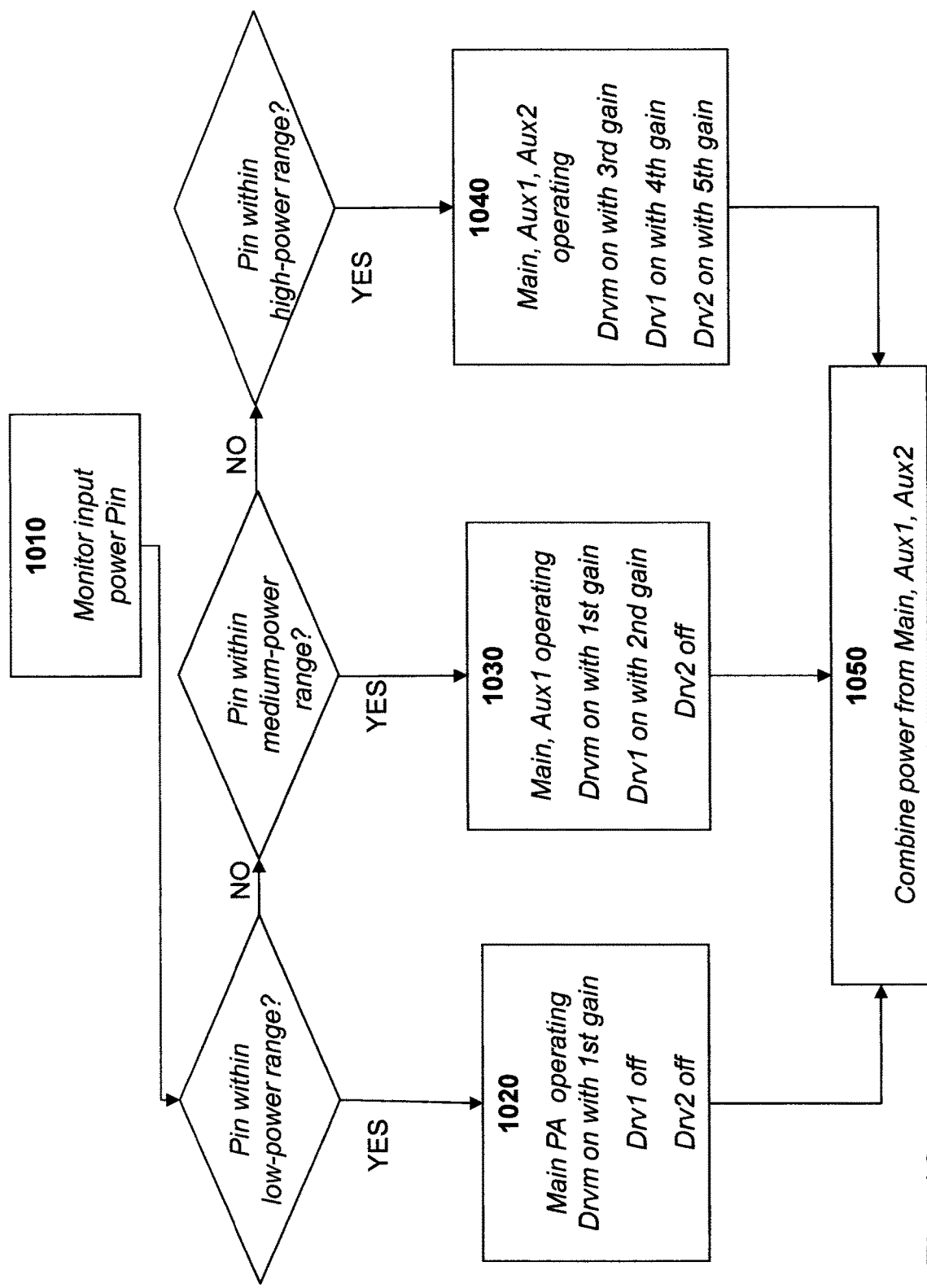
FIG. 10 is a flow chart illustrating a method to operate the amplifier arrangement according to embodiments herein.

Corresponding embodiments of a method for operating the power amplifier arrangement 200 to amplify input signals to an output signal for delivering to a load, will now be described with reference to FIG. 10. As mentioned above, the power amplifier arrangement 200 comprises a main amplifier circuit 210, a first and second auxiliary amplifier circuits 221, 222 and a single hybrid coupler circuit 230. The single hybrid coupler circuit 230 comprises four ports, a first port 231 is coupled to the output of the main amplifier circuit 210, a second port 232 is coupled to the output of the first auxiliary amplifier circuit 221, a third port 233 is coupled to the output of the second auxiliary amplifier circuit 222 and a fourth port 234 is coupled to a load 240. The method comprises the following actions.

Action 1010

In order to properly operate the 3 amplifier circuits depends on input signal levels, the input signal power Pin is monitored and determined whether it is in a first low power range, a second medium power range or a third high power range.

Action 1020

When the input signal is in a first low power range, a first drive signal with a first gain is applied to the main amplifier circuit 210 and the main amplifier circuit 210 is operating. An output signal from the main amplifier circuit 210 is coupled to the first port of the hybrid coupler circuit 230. The first and second auxiliary amplifier circuits 221, 222 are not operating. For example, the drive amplifier Drvm turns on and its gain is set to the first gain, e.g. the drive signal from Drvm has a power ramp slope as curve 501 shown in FIG. 5a, the drive amplifiers Drv1 and Drv2 are off and no drive signals are supplied to the first and second auxiliary amplifier circuits 221, 222.

Action 1030

When the input signal is in a second medium power range, the main amplifier circuit 210 is still operating with the first drive signal having the first gain, further the first auxiliary amplifier circuit 221 starts to operate by applying a second drive signal having a second gain. An output signal from the first auxiliary amplifier circuit 221 is coupled to a second port of the hybrid coupler circuit 230. For example, the drive amplifier Drv1 to the first auxiliary amplifier circuit 221 is turned on and its gain is set to the second gain, e.g. the drive signal from Drv1 has a power ramp slope as curve 503 shown in FIG. 5a. The second auxiliary amplifier circuit 222 is still not operating.

Action 1040

When the input signal is in a third high power range, i.e. the input signal has higher power than the input signal in the second medium range, the main and the first auxiliary amplifier circuits are still operating. However the first drive signal to the main amplifier circuit 210 is set to have a third gain which is higher than the first gain. The third gain may be the same as the gain of the second drive signal to the first auxiliary amplifier circuit 221. For example, the drive signal to the main amplifier circuit 210 has a slope as curve 502 shown in FIG. 5a. The drive signal to the first auxiliary amplifier circuit may keep the same second gain, for example, in FIG. 5a, curve 502 and 504 has same slope. The drive signal to the first auxiliary amplifier circuit may also be set to have a forth gain different from the second gain, for example in FIG. 5b, curve 502 and 504 has different slope. Further the second auxiliary amplifier circuit 222 starts to operate by applying a third drive signal having a fifth gain, and an output signal from the second auxiliary amplifier circuit 222 is coupled to a third port of the hybrid coupler circuit 230. For example, the drive amplifier Drv2 turns on and its gain is set to the fifth gain, e.g. the drive signal has a slope as curve 505 shown in FIG. 5a.

Action 1050

Output power from the main, the first and second auxiliary amplifier circuits 210, 221, 222 are combined in the hybrid coupler circuit 230 and an output power is delivered to the load 240 from the fourth port of the hybrid coupler circuit 230.

To conclude, the amplifier arrangements 200, 300, 700, 800 according to embodiments herein have several advantages. The proposed solution employs only a single hybrid coupler which is a single coupling structure to combine power properly from all 3 amplifier circuits to achieve 3 distinctive efficiency maximum as any other 3-way Doherty PAs.

Compared with other 3-way DPAs in prior art, the single hybrid coupler circuit according to embodiments herein working as a 3-way Doherty combiner is the simplest and smallest structure. In printed-circuit board (PCB) implementations, the hybrid coupler circuit may be a 3-dB quadrature type combiner. They are common, commercially available, physically small on high permittivity materials and cheap for manufacturing as surface-mount devices. Accordingly, the amplifier arrangement 200, 300, 700, 800 according to the embodiments herein may be more compact, less complicated and less expensive. More significantly, in MM IC implementations, chip-area reducing and cost saving may be 50% more than those 3-way DPAs in prior arts.

The embodiments herein are not limited to the above described preferred embodiments. Various alternatives, modifications and equivalents may be used. When using the word "comprise" or "comprising" it shall be interpreted as non-limiting, i.e. meaning "consist at least of". Therefore, the above embodiments should not be taken as limiting the scope of the invention, which is defined by the appending claims.

The invention claimed is:

1. An amplifier apparatus for amplifying input signals to an output signal for delivery to a load, the amplifier apparatus comprising:
a main amplifier circuit having an input for receiving an input signal and an output;
a first auxiliary amplifier circuit and a second auxiliary amplifier circuit, each one of the first and second auxiliary amplifier circuits having an input for receiving an input signal and an output, and wherein each one of the first and second auxiliary amplifier circuits being selectively operable to operate in combination with the main amplifier circuit;
a single hybrid coupler circuit having a first port being coupled to the output of the main amplifier circuit, wherein the hybrid coupler circuit further has a second port coupled to the output of the first auxiliary amplifier circuit, a third port coupled to the output of the second auxiliary amplifier circuit and a fourth port coupled to the load; and
a signal processing component configured to control power of drive signals and selectively apply the drive signals with a specific gain with respect to the input signals to the main amplifier circuit, the first and second auxiliary amplifier circuits such that the drive signal to the main amplifier circuit has a higher gain for higher level input signals than a gain for lower level input signals, and each of the first and second auxiliary amplifier circuits is selectively operable to operate in combination with the main amplifier circuit.

2. The amplifier apparatus of claim 1, wherein the signal processing component comprises variable gain amplifiers configured to provide the drive signals to the main amplifier circuit, the first and second auxiliary amplifier circuits.

3. The amplifier apparatus of claim 1, wherein the signal processing component comprises a power detector, wherein the power detector is configured to sense power of the input signals and output from the power detector is used to control power of the driving signals to the main amplifier circuit, the first and second auxiliary amplifier circuits.

4. The amplifier apparatus of claim 1, wherein the drive signals to the main amplifier circuit, the first and second auxiliary amplifier circuits are delayed by 0, 90 and 180 degrees respectively with respect to the input signal.

5. The amplifier apparatus of claim 1, wherein the amplifier apparatus is a single-input-single-output amplifier and further comprises a power splitter configured to split an input signal received by the power splitter into the input signals and to feed each split input signal to the respective input of the main amplifier circuit, the first and second auxiliary amplifier circuits.

6. The amplifier apparatus of claim 5, wherein the power splitter is an uneven 3-way Wilkinson splitter.

7. The amplifier apparatus of claim 1, wherein the hybrid coupler circuit comprises any one of a Branch-line coupler, a lumped elements coupler, a coupled-line coupler or a Lange coupler.

8. The amplifier apparatus of claim 1, wherein the hybrid coupler circuit comprises a 3-dB quadrature hybrid combiner.

9. The amplifier apparatus of claim 1, further comprising one or more output matching networks, each output matching network is coupled to a respective one of the four ports of the hybrid coupler circuit to perform impedance transformation.

10. The amplifier apparatus of claim 9, wherein said one or more output matching networks comprise transmission lines or lumped elements.

11. The amplifier apparatus of claim 1, wherein a characteristic impedance of the hybrid coupler circuit is configured to match a loading impedance of the load.

12. The amplifier apparatus of claim 1, wherein any one of the main amplifier circuit, the first and second auxiliary amplifier circuits comprises any of
   a. a high electron mobility transistor, HEMT;
   b. a heterojunction bipolar transistor, HBT; or
   c. a laterally-defused metal-oxide-semiconductor, LDMOS, transistor made of semiconductor materials from any of
      a. Gallium nitride, GaN;
      b. Silicon, Si;
      c. Gallium arsenide, GaAs; or
      d. Indium phosphide, InP.

13. An electronic device comprising the amplifier apparatus of claim 1.

14. The electronic device of claim 13, wherein the electronic device is a monolithic integrated circuit, a radio transmitter, or a radio base station.

15. The electronic device of claim 14, wherein the radio transmitter comprises a digital pre-distortion apparatus connected to the amplifier apparatus.

16. A method for operating a power amplifier apparatus to amplify input signals to an output signal for delivery to a load, wherein the power amplifier apparatus comprises a main amplifier circuit, a first and second auxiliary amplifier circuits and a single hybrid coupler circuit comprising a first port being coupled to the output of the main amplifier circuit, a second port being coupled to the output of the first auxiliary amplifier circuit, a third port being coupled to the output of the second auxiliary amplifier circuit and a fourth port being coupled to the load, the method comprising:
   monitoring power of the input signals;
   when the input signal is in a first power range, operating the main amplifier circuit by applying a first drive signal having a first gain with respective to the input signal;
   when the input signal is in a second power range, operating the main amplifier circuit by applying the first drive signal having the first gain and operating the first auxiliary amplifier circuit by applying a second drive signal having a second gain with respective to the input signal;
   when the input signal is in a third power range, operating the main, the first and second auxiliary amplifier circuits by applying the first drive signal with a third gain to the main amplifier circuit, applying the second drive signal with a fourth gain to the first auxiliary amplifier circuit and applying a third drive signal with a fifth gain to the second auxiliary amplifier circuit; and
   combining output power from the main, the first and second auxiliary amplifier circuits in the hybrid coupler circuit and delivering an output power to the load from the fourth port of the hybrid coupler circuit.

17. The method of claim 16, wherein the input signal in the first power range has lower power compared to the input signal in the second power range, the input signal in the third power range has higher power compared to the input signal in the second power range, and the third gain is higher than the first gain.

* * * * *